United States Patent
Das et al.

(10) Patent No.: US 9,547,354 B2
(45) Date of Patent: Jan. 17, 2017

(54) SYSTEM AND METHOD FOR INCREASING CURRENT MONITOR POWER TELEMETRY ACCURACY

(71) Applicants: Girish Prasad Das, Round Rock, TX (US); Johan Rahardjo, Austin, TX (US)

(72) Inventors: Girish Prasad Das, Round Rock, TX (US); Johan Rahardjo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 147 days.

(21) Appl. No.: 13/861,224

(22) Filed: Apr. 11, 2013

(65) Prior Publication Data

US 2014/0306831 A1    Oct. 16, 2014

(51) Int. Cl.
| | |
|---|---|
| G01D 4/00 | (2006.01) |
| G06F 1/32 | (2006.01) |
| G06F 11/30 | (2006.01) |
| G01R 15/09 | (2006.01) |

(52) U.S. Cl.
CPC .............. G06F 1/3206 (2013.01); G01R 15/09 (2013.01); G06F 11/3058 (2013.01)

(58) Field of Classification Search
CPC ........................... G06F 11/3058; G06F 1/3206
USPC ............ 340/870.02, 870.04, 870.05, 870.07, 340/870.16
See application file for complete search history.

(56) References Cited

U.S. PATENT DOCUMENTS

| | | | |
|---|---|---|---|
| 4,710,747 A | 12/1987 | Holland | |
| 5,920,189 A | 7/1999 | Fisher et al. | |
| 5,923,269 A * | 7/1999 | Shuey et al. .............. | 340/870.02 |
| 6,980,124 B2 * | 12/2005 | Kong et al. .............. | 340/870.11 |
| 2005/0092939 A1 * | 5/2005 | Coss, Jr. ............. | H01J 37/3023 |
| | | | 250/492.21 |
| 2008/0183407 A1 * | 7/2008 | Yeh et al. ........................ | 702/60 |
| 2011/0012542 A1 * | 1/2011 | Inamura .................. | H02M 1/08 |
| | | | 318/139 |
| 2011/0221405 A1 * | 9/2011 | Tang et al. .................... | 323/234 |

FOREIGN PATENT DOCUMENTS

| | | |
|---|---|---|
| EP | 2218185 | 4/2009 |
| WO | 2009/055217 A1 | 4/2009 |

* cited by examiner

*Primary Examiner* — Jennifer Mehmood
*Assistant Examiner* — Yong Hang Jiang
(74) *Attorney, Agent, or Firm* — Baker Botts L.L.P.

(57) ABSTRACT

Systems and method for increasing current monitor accuracy are disclosed. The systems and methods may include receiving a run-time load value from a current monitor, determining a component parameter value associated with the run-time load value, and communicating the component parameter value to the current monitor.

10 Claims, 4 Drawing Sheets

SYSTEM AND METHOD FOR INCREASING CURRENT MONITOR POWER TELEMETRY ACCURACY

TECHNICAL FIELD

This invention relates generally to the field of information handling systems and more specifically to increasing current monitor accuracy.

BACKGROUND

As the value and use of information continues to increase, individuals and businesses seek additional ways to process and store information. One option available to users is information handling systems ("information handling systems"). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the ubiquity of information handling systems increases, so does the importance of operating efficiencies. One such operating efficiency may include power consumption. One way in which information handling systems consume power is through the use of resistive elements in current monitoring. However, in order for these elements to monitor current over the greatest possible range, accuracy may be diminished while at the same time increasing the power loss due to higher offset voltages.

SUMMARY OF THE DISCLOSURE

In accordance with certain embodiments of the present disclosure, systems and method for increasing current monitor accuracy are disclosed. The systems and methods may include receiving a run-time load value from a current monitor, determining a component parameter value associated with the run-time load value, and communicating the component parameter value to the current monitor.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

For the purposes of this disclosure, an information handling system ("information handling system") may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system ("IHS") may include memory, one or more processing resources, such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Figure 1:
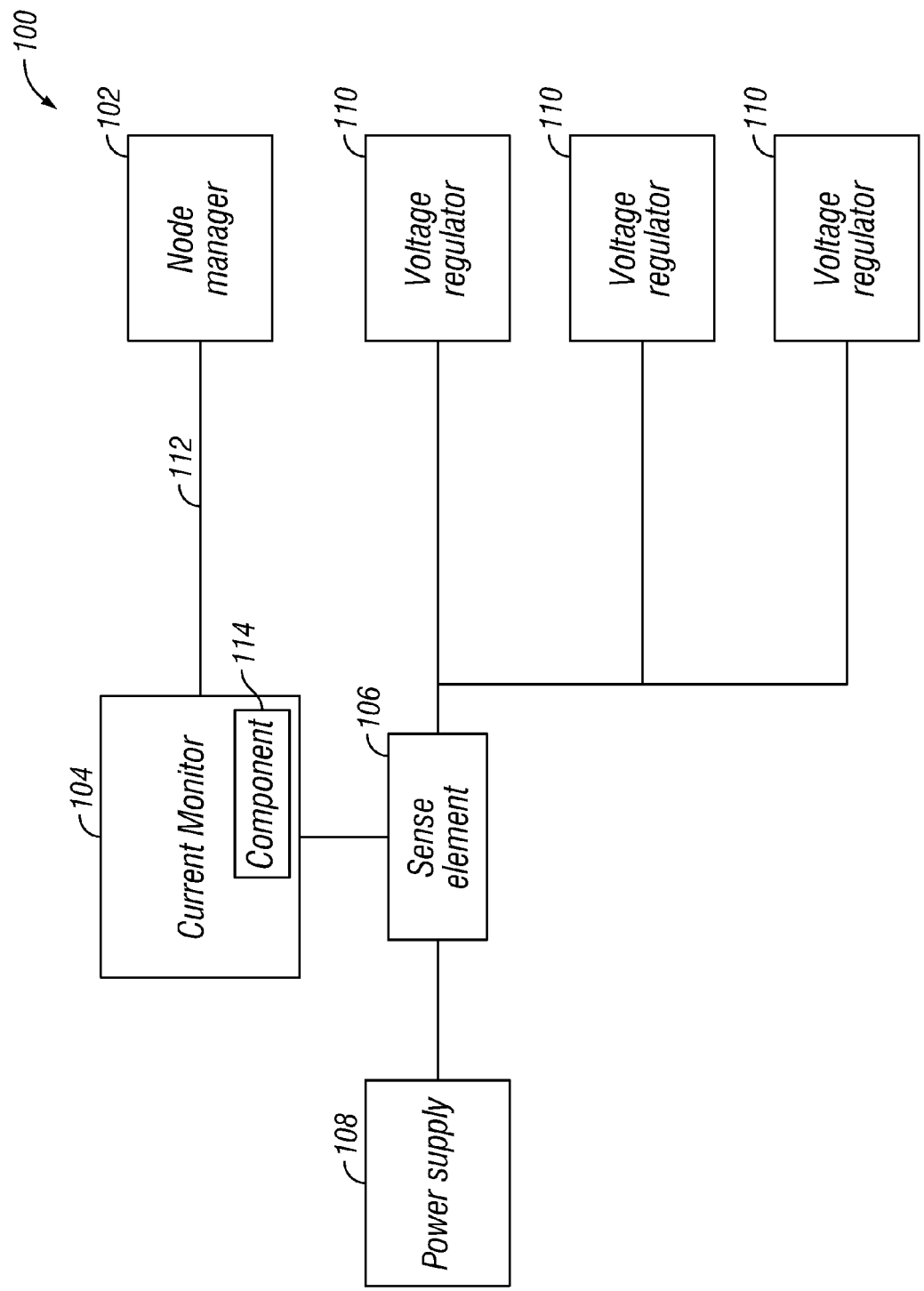
FIG. 1 illustrates an example information handling system for increasing current monitor power telemetry accuracy, in accordance with certain embodiments of the present disclosure.

FIG. 1 illustrates an example information handling system 100 for increasing current monitor power telemetry accuracy, in accordance with certain embodiments of the present disclosure. System 100 may be configured to dynamically adjust a run-time parameter associated with current monitoring in order to increase telemetry accuracy. In some embodiments, system 100 may include node manager 102, current monitor 104, sense element 106, power supply 108, and a plurality of voltage regulators 110.

In some embodiments, node manager 102 may be any hardware, software, firmware, and/or combination thereof configured to manage certain performance aspects of information handling system 100. For example, node manager 102 may be a baseboard management controller ("BMC"), and/or other component(s) configured to manage certain performance aspects of information handling system 100. In some embodiments, node manager 102 may be configured to analyze information received from other components of information handling system 100. For example, node manager 102 may be configured to receive information regarding the current, historical, and/or analyzed data associated with other components of information handling system 100. In the configuration of information handling system 100 depicted in FIG. 1, for example, node manager 102 may be configured to receive data associated with a load associated with sense element 106, as described in more detail below with reference to FIGS. 3-6. This may include, in some embodiments, access to and/or control of a lookup table including a range of potential values associated with that received data, as described in more detail below with reference to FIGS. 3-6.

In some embodiments, node manager 102 may be communicatively coupled to current monitor 104 via bus 112. Node manager 102 may, in some configurations, be configured to be a master of bus 112. In some configurations of information handling system 100, node manager 102 may be configured to communicate commands to current monitor 104 via bus 112, as described in more detail below with reference to FIGS. 3, 6.

In some embodiments, bus 112 may be a digital bus configured to provide a communication path between node manager 102 and current monitor 104. For example, bus 112 may be a PMBus bus between node manager 102 and current monitor. Although a certain number of components of information handling system 100 are depicted as connect to bus 112 for illustrative purposes, more, fewer, and/or different components may be present for a given configuration of information handling system 100 without departing from the scope of the present disclosure.

In some embodiments, current monitor 104 may be one or more electronic component(s) configured to monitor a current associated with one or more other component(s) of information handling system 100. In some embodiments, current monitor 104 may include one or more adjustable component(s) 114 configured to have one or more adjustable parameter(s) that may be adjusted remotely. For example, current monitor 104 may be a currently available current monitor, e.g., the INA220 from Texas Instruments, that may include (for example) an analog-to-digital converter ("ADC"). The ADC may include a programmable-gain amplifier that may be configured through a digital interface. For example, current monitor 104 may be configured to receive updated parameter(s) for component 114 via bus 112 from node manager 102.

In some embodiments, current monitor 104 may have associated with it one or more sense element(s) 106. For example, sense element 106 may be a resistive element configured to measure one or more current(s) associated with one or more component(s) of information handling system 100. In some configurations, sense element 106 may be configured to measure a current associated with power supply 108 and/or voltage regulators 110.

In some embodiments, current monitor 104 may be further configured to track, store, and analyze historical current values associated with sense element 106. For example, current monitor 104 may be configured to average load values associated with sense element 106 over time in order to dynamically determine an appropriate setting for an adjustable parameter of component 114 of current monitor 104, as described in more detail below with reference to FIGS. 3-6. In the same or alternative embodiments, current monitor 104 may be configured to analyze load values in other ways in addition to averaging data values.

In some embodiments, power supply 108 may be any known power supply configured to supply power to information handling system 100. In some embodiments, voltage regulator 110 may be any appropriate voltage regulator configured to regulate a voltage associated with one or more component(s) of information handling system 100. For example, voltage regulator 110 may be a processor voltage regulator, a memory voltage regulator, and/or a voltage regulator associated with any other miscellaneous component of information handling system 100.

In operation, node manager 102 may have access to a lookup table, as described in more detail below with reference to FIGS. 3, 6. The lookup table may have associated with it a plurality of ranges associated with the load associated with sense element 106. Each of the plurality of ranges may have associated therewith a value of an adjustable parameter associated with component 114 of current monitor 104. Node manager 102 may initialize component 114 of current monitor 104 at an initial value. Current monitor 104 may be configured to analyze load values associated with sense element 106 in order to determine an actual load value. For example, current monitor 104 may average load values every 100 ms. Node manager 102 may then compare the analyzed load value to the values of the lookup table, as described in more detail below with reference to FIGS. 3, 6. If the lookup table indicates a change to the adjustable parameter, node manager 102 may send a command to current monitor 104 to alter the adjustable setting associated with component 114 of current monitor 104.

The following example values are provided to aid in illustration and are in no way intended to limit the scope of the present disclosure. As an example configuration of information handling system 100, current monitor 104 may include an INA220 current monitor component from Texas Instruments. Such a current monitor component may have a certain accuracy value for a high power range (e.g., higher sense voltage across sense element), but a second, lower accuracy value for a low power range (e.g., lower sense voltage across sense element). The current monitor component may also include an adjustable component 114 such as an ADC. If the ADC is programmed once (e.g., "static" programming), it may be programmed with a maximum power range value so that it may operate over the maximum range without damage to the ADC. For example, the ADC may have an associated gain value that may be adjustable.

In the illustrative configuration using the INA220, the ADC gain may be adjusted from a maximum value (e.g., 320 mV), to a minimum value (e.g., 40 mV). In a configuration in which the ADC gain is statically programmed, efficiencies associated with information handling system 100 may be lost and/or reduced. For example, system 100 may operate most of the time at a medium- to low-power level. At a lower power level, accuracy of the current monitor component may be reduced due to a low sense voltage across the associated sense element 106. This may be exacerbated by a comparatively high offset voltage associated with the ADC (e.g., an offset voltage set high so that the ADC may handle higher sense voltages at higher power levels). For example, setting an ADC to operate in a range of 0-320 A, an inaccuracy associated with the ADC may be in the range of 3% due to a 100 μA offset voltage. However, setting the ADC to operate in the range of 0-40 A, the inaccuracy associated with the ADC may be in the range of 1.75% due to a lower, 50 μA offset voltage.

Figures 2, 3:
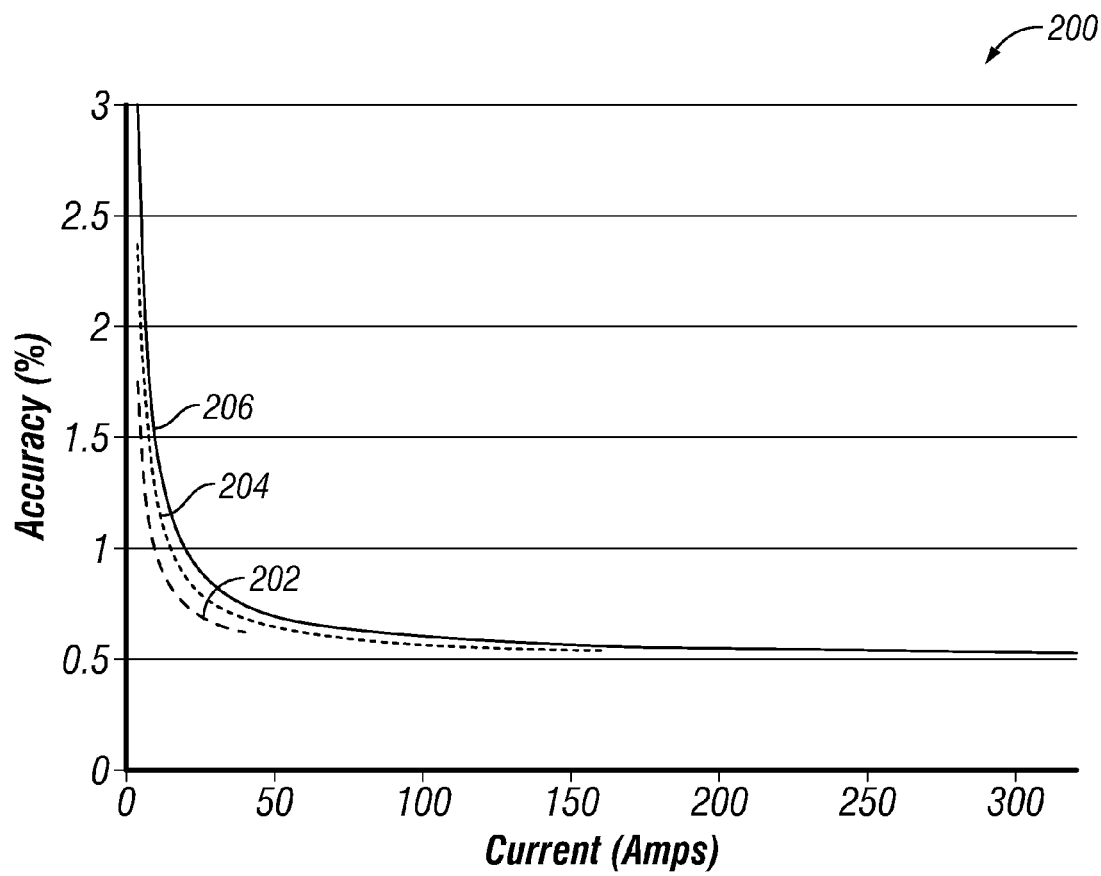
FIG. 2 illustrates an example accuracy diagram or a prior art solution for setting an adjustable parameter value associated with component of current monitor 104, in accordance with certain embodiments of the present disclosure.
FIG. 3 illustrates an example lookup table for mapping a plurality of load range values to a corresponding plurality of parameter values, in accordance with certain embodiments of the present disclosure.

FIG. 2 illustrates an example accuracy diagram 200 or a prior art solution for setting an adjustable parameter value associated with component 114 of current monitor 104, in accordance with certain embodiments of the present disclosure. Diagram 200 includes three current vs. accuracy plots:

320 A plot 202, 160 A plot 204, and 40 A plot 206. As depicted in FIG. 2, 320 A plot 202 illustrates that, in order to have coverage over the broadest current range, a system may sacrifice accuracy in a lower-power portion of that range.

To improve accuracy at lower power settings, while maintaining the ability to monitor current at higher power settings, information handling system 100 may be configured to dynamically program an adjustable component 114 of current monitor 104, as described in more detail above and below with reference to FIGS. 3-6. As described above, a dynamic programming may allow current monitor 104 to adjust from a higher-power mode to a lower-power mode. This may allow for increased accuracy over a broader power range.

FIG. 3 illustrates an example lookup table 300 for mapping a plurality of load range values 302 to a corresponding plurality of parameter values 304, in accordance with certain embodiments of the present disclosure. As described in more detail above with reference to FIG. 1, and below with reference to FIGS. 4-6, node manager 102 may be configured to receive data associated with current and/or historical values of the current load associated with sense element 106. Node manager 102 may be further configured to compare these values against corresponding values associated with parameters of adjustable component 114 of current monitor 104 in order to dynamically program component 114.

In some embodiments, table 300 may include a plurality of load range values 302. For example, table 300 may include values for the load ranges of: 0-40 A, 41-160 A, and 161-330 A. Table 300 may also include a corresponding plurality of parameter values 304. For example, table 300 may include parameter values "PGA1," "PGA3," and "PGA3." As described in more detail above with reference to FIG. 1, component 114 of current monitor 104 may have associated with it an adjustable parameter such as a programmable gain amplifier value. Table 300 may be configured to include a plurality of parameter values 304 corresponding to predetermined values of this adjustable parameter. These parameter values 304 may be different depending on the preferred configuration of information handling system 100 and may be chosen, for example, in order to provide a desired accuracy level for current readings at a certain load value.

Figure 4:
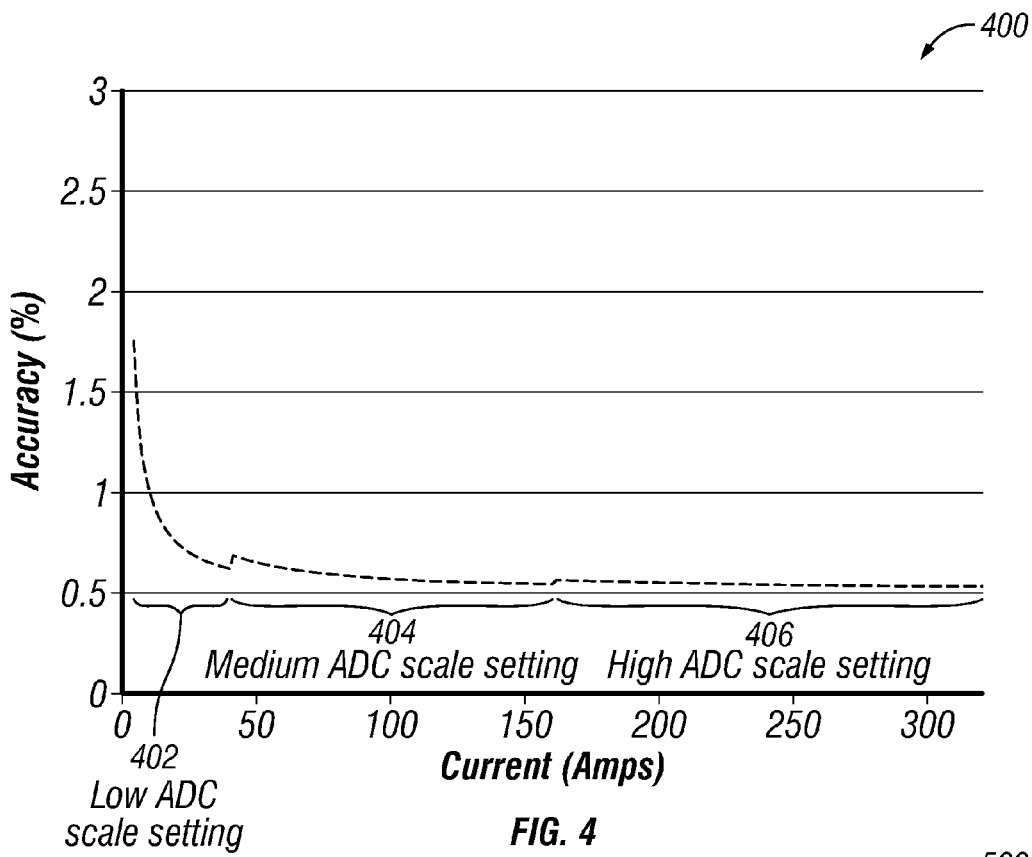
FIG. 4 illustrates an example accuracy diagram for dynamically programming an adjustable parameter value associated with component of current monitor, in accordance with certain embodiments of the present disclosure.

FIG. 4 illustrates an example accuracy diagram 400 for dynamically programming an adjustable parameter value associated with component 114 of current monitor 104, in accordance with certain embodiments of the present disclosure. In some embodiments, diagram 400 may include lower power range 402, medium power range 404, and high power range 406.

As described in more detail above with reference to FIGS. 1-3 and below with reference to FIGS. 5-6, information handling system 100 may be configured to dynamically program an adjustable parameter associated with component 114 of current monitor 104. For example, node manager 102 may be configured to adjust an amplifier gain associated with an ADC of current monitor 104 based on actual load measurements communicated to node manager 102 by current monitor 104. In some embodiments, current monitor 104 may compare the received data values against a lookup table, as described in more detail above with reference to FIGS. 1, 3. In some embodiments, load range values 302 of table 300 may generally correspond to lower power range 402, medium power range 404, and high power range 406 of diagram 400. As depicted in FIG. 4, information handling system 100 may have an operable monitoring range over a wide band while reducing accuracy errors in lower power range 402 and/or medium power range 404.

It may be appreciated by one of ordinary skill in the art, that a greater or lesser granularity in accuracy may be necessary or desired in a given configuration of information handling system 100 without departing from the scope of the present disclosure. Therefore, table 300 and/or diagram 400 may include more, fewer, or different regions, ranges, and/or values. Further, table 300 may have a plurality of values generally corresponding to a range of diagram 400, depending on the given configuration of information handling system 100.

Figure 5:
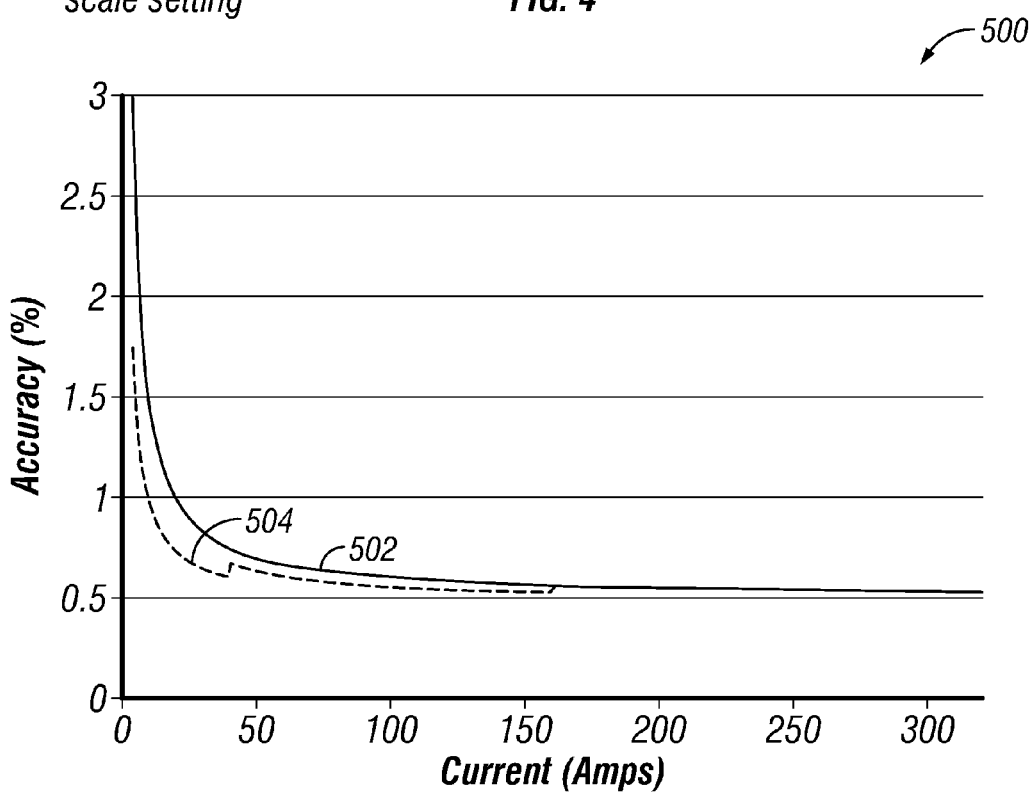
FIG. 5 illustrates an example accuracy diagram comparing a full range, static-programmed accuracy plot and a full range, dynamically programmed accuracy plot, in accordance with certain embodiments of the present disclosure.

For ease of comparison between the full-range coverage depicted in FIGS. 2, 4, FIG. 5 illustrates an example accuracy diagram 500 comparing a full range, static-programmed accuracy plot 502 and a full range, dynamically programmed accuracy plot 504, in accordance with certain embodiments of the present disclosure. As depicted in FIG. 5, dynamically program accuracy plot 504 may have a reduced accuracy penalty in a lower power band than that illustrated by static-programmed accuracy plot 502.

Figure 6:
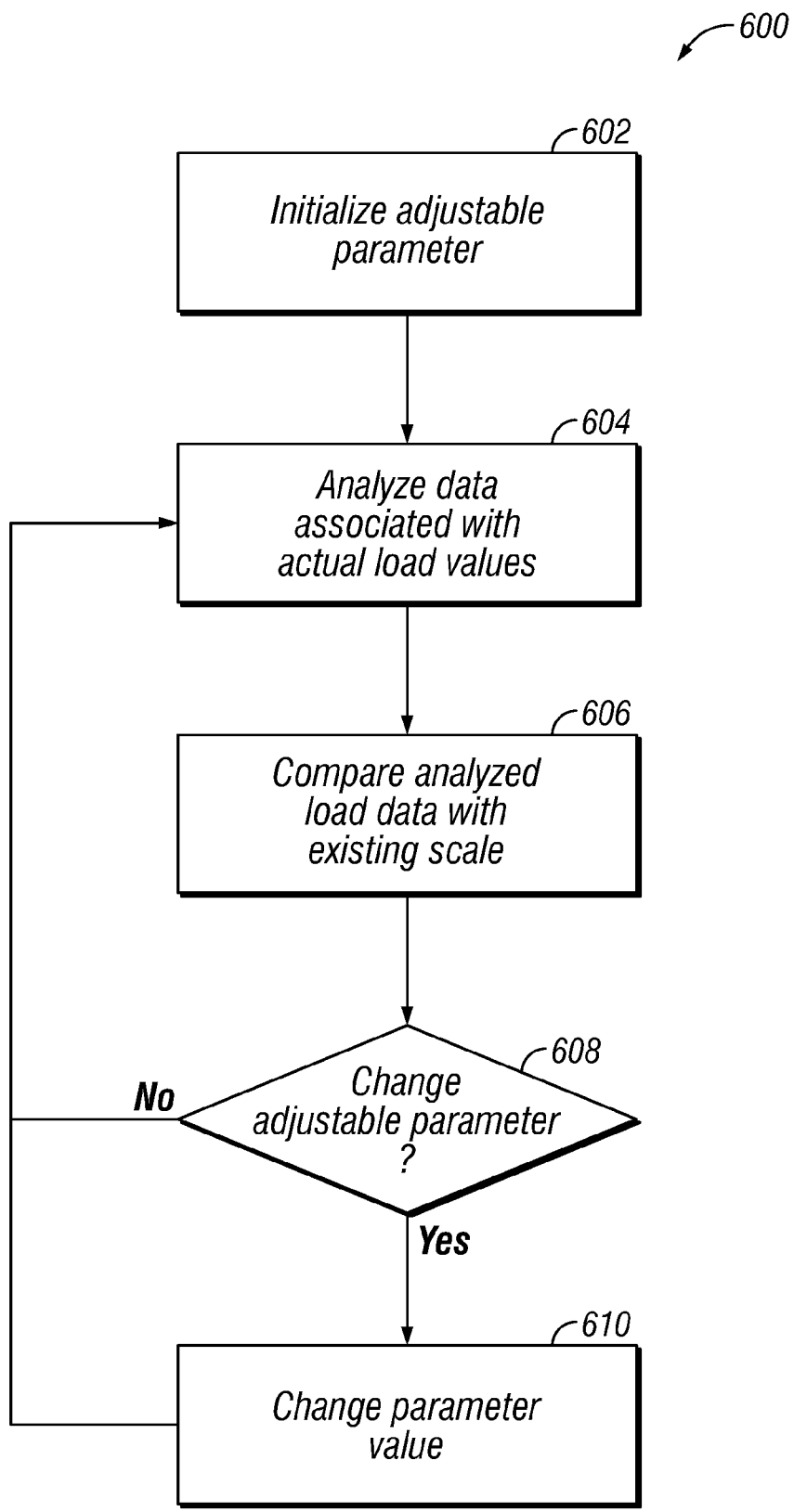
FIG. 6 illustrates a flowchart of an example method for increasing current monitor accuracy in information handling system, in accordance with certain embodiments of the present disclosure.

FIG. 6 illustrates a flowchart of an example method 600 for increasing current monitor accuracy in information handling system 100, in accordance with certain embodiments of the present disclosure. Method 600 may include initializing a component value, monitoring load values, analyzing load values, and adjusting component values.

According to one embodiment, method 600 may begin at step 602. Teachings of the present disclosure may be implemented in a variety of configurations. As such, the preferred initialization point for method 600 and the order of steps 6602-610 comprising method 600 may depend on the implementation chosen.

At step 602, method 600 may initialize an adjustable parameter of an adjustable component 114 of current monitor 104, as described in more detail above with reference to FIGS. 1-5. For example, node manager 102 may initialize an ADC of component 114 with the highest load range value. After initializing the adjustable parameter value, method 600 may proceed to step 604.

At step 604, method 600 may analyze data associated with actual load values associated with information handling system 100, as described in more detail above with reference to FIGS. 1-5. For example, current monitor 104 may be configured to average (e.g., every 100 ms) data received from sense element 106 regarding the actual load associated with sense element 106 (e.g., the load of power supply 108 and/or voltage regulators 110). After analyzing the data, method 600 may proceed to step 606.

At step 606, method 600 may compare the analyzed load data with an existing scale for the adjustable parameter, as described in more detail above with reference to FIGS. 1-5. For example, node manager 102 may be configured to compare the averaged load data with a plurality of load ranges stored for example at table 300. Based on the lookup, method 600 may identify a corresponding value for the adjustable parameter. After comparing the load data, method 600 may proceed to step 608.

At step 608, method 600 may determine whether to change the value of the adjustable parameter, as described in more detail above with reference to FIGS. 1-5. For example, node manager 102 may be configured to determine whether the analyzed load data indicates that a change to the adjustable parameter may be indicated by, for example, table 300. If a change to the adjustable parameter is indicated, method 600 may proceed to step 610. If no change is indicated, method 600 may return to step 604, where method 600 may continue to analyze load data.

At step 610, method 600 may change the parameter value associated with adjustable component 114 of current monitor 104, as described in more detail above with reference to FIGS. 1-5. For example, node manager 102 may send a command to current monitor 104 via bus 112 to change an ADC setting associated with current monitor 104.

Although FIG. 6 discloses a particular number of steps to be taken with respect to method 600, method 600 may be executed with more or fewer steps than those depicted in FIG. 6. For example, in some configurations of information handling system 100, step 602 of method 600 may be unnecessary.

What is claimed:

1. An information handling system for increasing current monitor accuracy, comprising:
   a current monitor; and
   a node manager communicatively coupled to the current monitor;
   wherein:
      the current monitor is configured to:
         obtain a set of load values; and
         statistically analyze the set of load values to generate a run-time load value based on the set of load values;
      the current monitor is associated with an adjustable component for configuring the current monitor to operate in one of a plurality of power modes;
      the node manager is configured to:
         receive the run-time load value from the current monitor;
         determine the one of the plurality of power modes in which the current monitor is to operate; and
         communicate a parameter to the adjustable component to configure the current monitor to operate in the determined one of the plurality of power modes;
      to determine the one of the plurality of power modes in which the current monitor is to operate, the node manager is configured to:
         determine, responsive to the run-time load value being within a first range of run-time load values, that the current monitor should operate in a first power mode, and
         determine, responsive to the run-time load value being within a second range of run-time load values, the second range being higher than the first range, that the current monitor should operate in a second power mode;
      the current monitor operates more accurately in the first power mode than in the second power mode; and
      the current monitor operates across a broader current range in the second power mode than in the first power mode.

2. The system of claim 1, further comprising a sense element communicatively coupled with the current monitor, the sense element configured to measure a load value and communicate the load value to the current monitor to be statistically analyzed as part of the statistically analyzed set of load values.

3. The system of claim 2, wherein the statistically analyzed set of load values comprises an average of load values over a period of time.

4. The system of claim 1, wherein the node manager comprises a lookup table, the lookup table comprising the run-time load value and the component parameter.

5. The system of claim 1, wherein the adjustable component is an analog-to-digital converter.

6. A method for increasing current monitor accuracy, the method comprising:
   receiving, by a node manager, a run-time load value from a current monitor communicatively coupled with the node manager, the current monitor configured to statistically analyze a set of load values to generate the run-time load value based on the set of load values, the current monitor further associated with an adjustable component for configuring the current monitor to operate in one of a plurality of power modes;
   determining, by the node manager, that the run-time load value is within a first range or a second range, the second range being higher than the first range;
   based on the run-time load value being within a first range, determining that the current monitor should operate in a first power mode, and
   based on the run-time load value being within a second range, determining that the current monitor should operate in a second power mode, wherein the current monitor operates more accurately in the first power mode than in the second power mode, and the current monitor operates across a broader current range in the second power mode than in the first power mode; and, in response:
   adjusting, by the node manager, the adjustable component within the current monitor such that the current monitor transitions to the determined power mode.

7. The method of claim 6, wherein the current monitor is further communicatively coupled with a sense element configured to measure a load value and communicate the load value to the current monitor to be statistically analyzed as part of the statistically analyzed set of load values.

8. The method of claim 7, wherein the statistically analyzed set of load values comprises an average of load values over a period of time.

9. The method of claim 6, wherein determining the component parameter value associated with the run-time load value comprises determining the component parameter value from a lookup table, the lookup table comprising the run-time load value and the component parameter.

10. The method of claim 6, wherein the adjustable component is an analog-to-digital converter.

* * * * *